(12) United States Patent
Kinsman et al.

(10) Patent No.: US 8,981,511 B2
(45) Date of Patent: Mar. 17, 2015

(54) MULTI-CHIP PACKAGE FOR IMAGING SYSTEMS

(75) Inventors: Larry D. Kinsman, Boise, ID (US); Chi-Yao Kuo, Taipei (TW)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/556,009

(22) Filed: Jul. 23, 2012

(65) Prior Publication Data

US 2013/0221470 A1    Aug. 29, 2013

Related U.S. Application Data

(60) Provisional application No. 61/604,636, filed on Feb. 29, 2012.

(51) Int. Cl.
*H01L 31/0232* (2014.01)
*H01L 27/146* (2006.01)

(52) U.S. Cl.
CPC . *H01L 27/14618* (2013.01); *H01L 2224/48091* (2013.01); *H01L 2224/73265* (2013.01); *H01L 2224/32145* (2013.01); *H01L 2924/10253* (2013.01)
USPC ........... 257/432; 257/291; 257/433; 257/434; 257/680; 257/686

(58) Field of Classification Search
CPC ............ H01L 27/146; H01L 27/14623; H01L 27/14618; H01L 27/14625
USPC ......... 257/685, 686, 434, 714, 680, 291, 432, 257/433
See application file for complete search history.

(56) References Cited

U.S. PATENT DOCUMENTS

| | | | |
|---|---|---|---|
| 5,327,325 A | 7/1994 | Nicewarner, Jr. | |
| 6,953,891 B2 | 10/2005 | Bolken et al. | |
| 7,169,645 B2 | 1/2007 | Bolken et al. | |
| 7,576,401 B1 | 8/2009 | De Guzman et al. | |
| 8,008,762 B2 | 8/2011 | Bolken et al. | |
| 8,115,296 B2 | 2/2012 | Bolken et al. | |
| 2004/0189854 A1* | 9/2004 | Tsukamoto et al. | 348/340 |
| 2005/0059188 A1 | 3/2005 | Bolken et al. | |
| 2005/0239227 A1* | 10/2005 | Aanegola et al. | 438/26 |
| 2006/0221225 A1* | 10/2006 | Tsukamoto et al. | 348/340 |
| 2007/0152345 A1* | 7/2007 | Wu et al. | 257/777 |

(Continued)

FOREIGN PATENT DOCUMENTS

EP    1445803    8/2004

*Primary Examiner* — Tan N Tran
(74) *Attorney, Agent, or Firm* — Treyz Law Group; Jason Tsai

(57) ABSTRACT

A multi-chip package may include an image sensor chip, an image signal processor (ISP) chip, a cover glass, and a package substrate. The ISP chip may be placed on the substrate. The image sensor chip may be placed over the ISP chip. An adhesive film may be formed between the ISP and image sensor chips. A cover glass may be suspended above the image sensor chip. The ISP chip and the image sensor chip may be wire bonded to the substrate. The multi-chip package may be hermetically sealed using a liquid compound or a dam structure. During normal operation, the ISP chip sends control signals to the image sensor chip via a first set of wire bond members and conductive traces in the substrate while the image sensor chip sends output signals to the ISP chip via a second set of wire bond terminals and conductive traces in the substrate.

18 Claims, 7 Drawing Sheets

(56) References Cited

U.S. PATENT DOCUMENTS

| | | |
|---|---|---|
| 2007/0284756 A1* | 12/2007 | Tsai et al. .................. 257/777 |
| 2008/0267616 A1 | 10/2008 | Kinoshita |
| 2009/0065929 A1* | 3/2009 | Hiranuma et al. ............ 257/724 |
| 2009/0166774 A1 | 7/2009 | Takahira |
| 2012/0133055 A1* | 5/2012 | Machida ..................... 257/777 |

* cited by examiner

`US 8,981,511 B2`

MULTI-CHIP PACKAGE FOR IMAGING SYSTEMS

This application claims the benefit of provisional patent application No. 61/604,636, filed Feb. 29, 2012, which is hereby incorporated by reference herein in its entirety.

BACKGROUND

This relates generally to imaging systems, and more particularly, to imaging systems with stacked-chip image sensors.

Image sensors are commonly used in imaging systems such as cellular telephones, cameras, and computers to capture images. In a typical arrangement, an image sensor includes an array of image sensor pixels and associated control and processing circuitry for operating the image sensor pixels. In a conventional imaging system, the control and processing circuitry is formed laterally from the image sensor pixels on a silicon semiconductor substrate. Each row of image sensor pixels typically communicates with the control circuitry along a common metal line on the silicon semiconductor substrate. Similarly, each column of image sensor pixels communicates with the control circuitry along a common metal line. Image signals captured using the image sensor pixels are then fed to the processing circuitry for performing analog-to-digital signal conversion and desired digital signal processing operations.

In this type of system, a substantial amount of valuable integrated circuit real estate has to be allocated to the control and processing circuitry. This increases the lateral footprint of the image sensor chip. An increased lateral footprint may be undesirable for compact imaging systems such as cellular telephones and cameras.

It would therefore be desirable to be able to provide improved imaging systems such as imaging systems with stacked-chip image sensors and to provide ways for packaging such types of stacked-chip image sensors.

DETAILED DESCRIPTION

Digital camera modules are widely used in imaging systems such as digital cameras, computers, cellular telephones, or other electronic devices. These imaging systems may include image sensors that gather incoming light to capture an image. The image sensors may include arrays of image sensor pixels. The pixels in an image sensor may include photosensitive elements such as photodiodes that convert the incoming light into digital data. Image sensors may have any number of pixels (e.g., hundreds or thousands or more). A typical image sensor may, for example, have hundreds of thousands or millions of pixels (e.g., megapixels).

Figure 1:
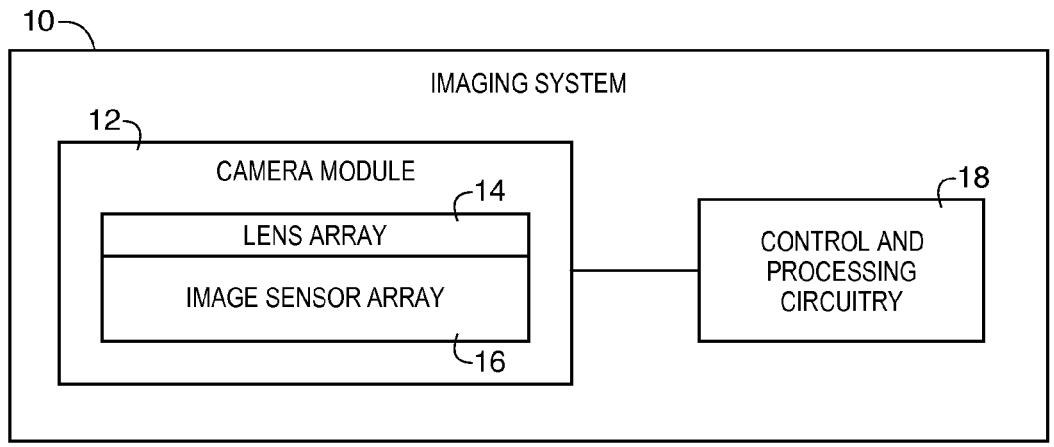
FIG. 1 is a diagram of an illustrative electronic device in accordance with an embodiment of the present invention.

FIG. 1 is a diagram of an illustrative imaging system for capturing images. Imaging system 10 of FIG. 1 may be a portable imaging system such as a camera, a cellular telephone, a video camera, or other6 imaging device that captures digital image data. Camera module 12 may be used to convert incoming light into digital image data. Camera module 12 may include an array of lenses 14 and a corresponding array of image sensors 16 (sometimes referred to as an image sensor array). Image sensors 16 may provide image data to control and processing circuitry 18.

Control and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using control and processing circuitry 18.

Processed image data may, if desired, be provided to external equipment (e.g., a computer or other device) using wired and/or wireless communications paths coupled to control and processing circuitry 18. Control processing circuitry may, for example, include row driver circuitry configured to drive row control signals associated with the image pixel arrays in image sensor array 16, column control circuitry coupled to column output lines associated with the image pixel arrays in image sensor array 16, circuitry for optimizing captured image quality, circuitry for running a built-in firmware, circuitry configured to implement desired image capture functions such as facial recognition, and other digital signal processing circuitry.

In some embodiments, a color filter array (CFA) may be formed on top of image sensor array 16 (not shown for simplicity). The color filters that are used for image sensor pixel arrays in the image sensors may, for example, be red filters, blue filters, and green filters. Each filter may form a continuous color filter layer that covers an individual pixel in an image pixel array, an image pixel array in an image sensor with multiple image pixel arrays, or an image sensor in an array of image sensors. Other filters such as white color filters, dual-band IR cutoff filters (e.g., filters that allow visible light and a range of infrared light emitted by LED lights), etc. may also be used.

Figure 2:
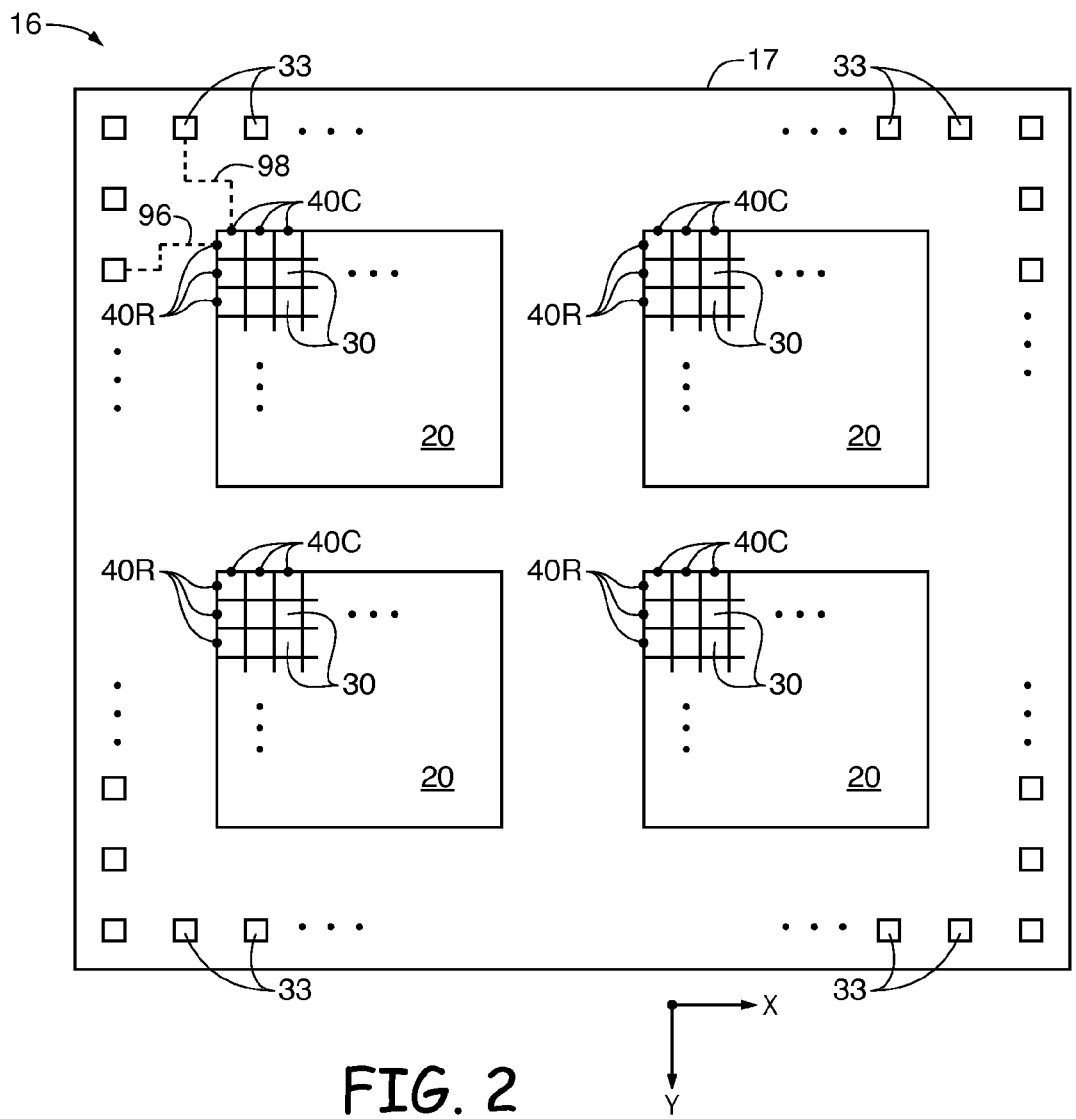
FIG. 2 is a top view of an illustrative image sensor integrated circuit having image pixel arrays and wire bond pads in accordance with an embodiment of the present invention.

As shown in FIG. 2, image sensor array 16 may be formed on an integrated circuit substrate 17. Image sensor array 16 may therefore sometimes be referred to an image sensor integrated circuit, an image sensor chip, or an image sensor die. In the example of FIG. 2, image sensor chip 16 includes four image pixel arrays such as image pixel arrays 20 on die 17. However, this is merely illustrative. If desired, image sensor chip 16 may include a single image pixel array, two image pixel arrays, three image pixel arrays, or more than four image pixel arrays.

Each pixel array 20 may have image sensor pixels such as image pixels 30 that are arranged in rows and columns. Image sensor pixel arrays 20 may have any suitable resolution (e.g., 640×480, 4096×3072, etc.). Image sensor pixels 30 may be formed on a planar surface (e.g., parallel to the x-y plane of FIG. 2) of a semiconductor substrate such as a silicon die.

As shown in FIG. 2, each image pixel array 20 may be provided with a plurality of conductive paths such as row interconnects 40R and column interconnects 40C. Row interconnects 40R and column interconnects 40C may be respectively coupled to first and second sets of wire bond pads 33 formed along the border of die 16. Configured in this way, row control signals may be conveyed to each image pixel 30 over row interconnects 40R via the first set of wire bond pads 33 (as indicated by path 96), whereas pixel output voltage signals may be received from column interconnects 40C via the second set of wire bond pads 33 (as indicated by path 98).

As consumer demand pushes towards compact high-resolution imaging devices, it becomes increasingly challenging to design an entire imaging system on a single integrated circuit die (sometimes referred to as a system-on-chip). Forming a high density image sensor array 16 and circuitry 18 on a single chip within a constrained amount of area can be an extremely difficult and time consuming design task.

An alternative to single-die packages is an arrangement in which multiple dies are placed within a single package. Such types of packages that contain multiple interconnected dies may sometimes be referred to as systems-in-package (SiPs), multi-chip modules (MCM), or multi-chip packages. Placing multiple chips (dies) into a single package may provide a more efficient use of area by allowing multiple dies to be stacked on top of one another (e.g., an image sensor chip may be stacked on top of a digital image processor chip), may allow each die to be implemented using the most appropriate technology process (e.g., an image sensor chip may be implemented using a first technology node, whereas the digital image processor chip may be implemented using a second technology node that is different than the first technology node), may increase the performance of die-to-die interface (e.g., driving signals from one die to another within a single package is substantially easier than driving signals from one package to another, thereby reducing power consumption of associated input-output buffers), and may help simplify printed circuit board (PCB) design (i.e., the design of the PCB on which the multi-chip package is mounted during normal system operation).

Figure 3:
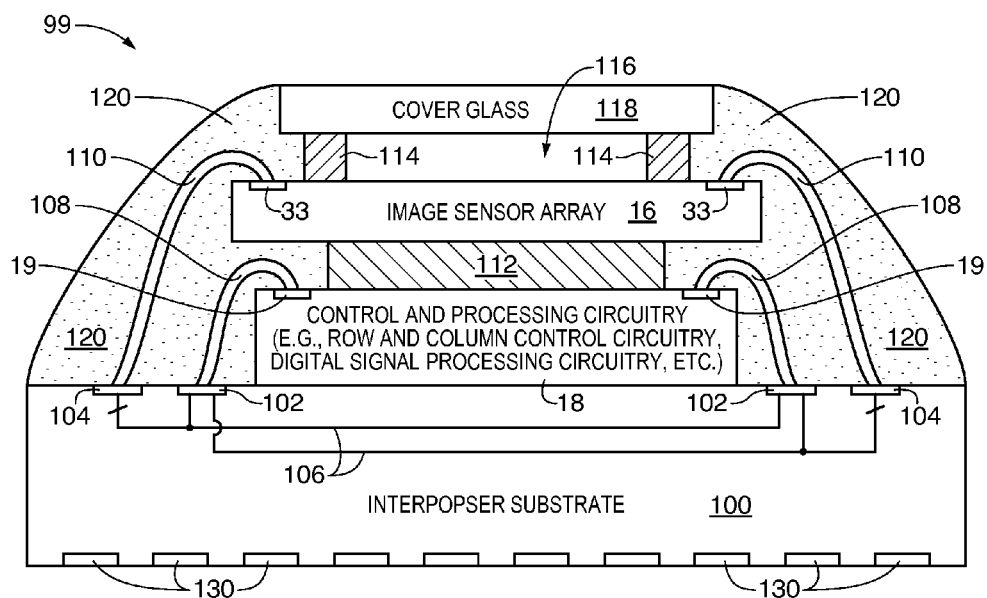
FIG. 3 is a cross-sectional side view of a multi-chip package for housing an image sensor chip that is stacked on top of an image signal processing chip in accordance with an embodiment of the present invention.

FIG. 3 is a cross-sectional side view of a multi-chip package 99 for housing an imaging system 10. As shown in FIG. 3, multi-chip package 99 may include a package substrate such as package substrate 100 (sometimes referred to as an interposer substrate), an image signal processing die (e.g., a chip that contains image sensor control and processing circuitry 18) mounted on substrate 100, an image sensor die (e.g., a chip that contains image sensor array 16) mounted over die 18, and a cover glass 118 mounted over die 16. Image signal processing die 18 may include along its periphery wire bond pads such as wire bond pads 19 that are connected to corresponding wire contact members 102 (sometimes referred to as wire pins, wire leads, or lead fingers) that are formed at a top surface of substrate 100 on which die 18 is mounted via bond wires 108. Image sensor die 16 may include along its periphery wire bond pads such as wire bond pads 33 that are connected to corresponding wire contact members 104 that are formed at the top surface of substrate 100 via bond wires 110. Wires 108 and 110 may be formed from gold (Au), aluminum (Al), copper (Cu), silver (Ag), other metals, or a combination of these materials (as examples).

Dies 16 and 18 may exchange digital and/or analog signals via conductive interposer traces 106 formed within interposer substrate 100. For example, image signal processing (ISP) die 18 may send row control signals for selectively accessing desired pixels 30 within image sensor die 10 via a first set of wires 108, traces 106, and wires 110, whereas signals output from each image sensor pixel on image sensor die 16 may be conveyed to die 18 via a second set of wires 108, traces 106, and wires 110. Package contact members such as contact members 130 may be formed at a bottom surface of substrate 100. Package contact members 130 may be coupled to at least some of wire contact members 102 associated with die 18 for receiving processed image data. Package contact members 130 may include pins, leads, springs, solder balls, or other conductive structures suitable for engaging with corresponding mating structures on a printed circuit board (as an example).

Figure 4A:
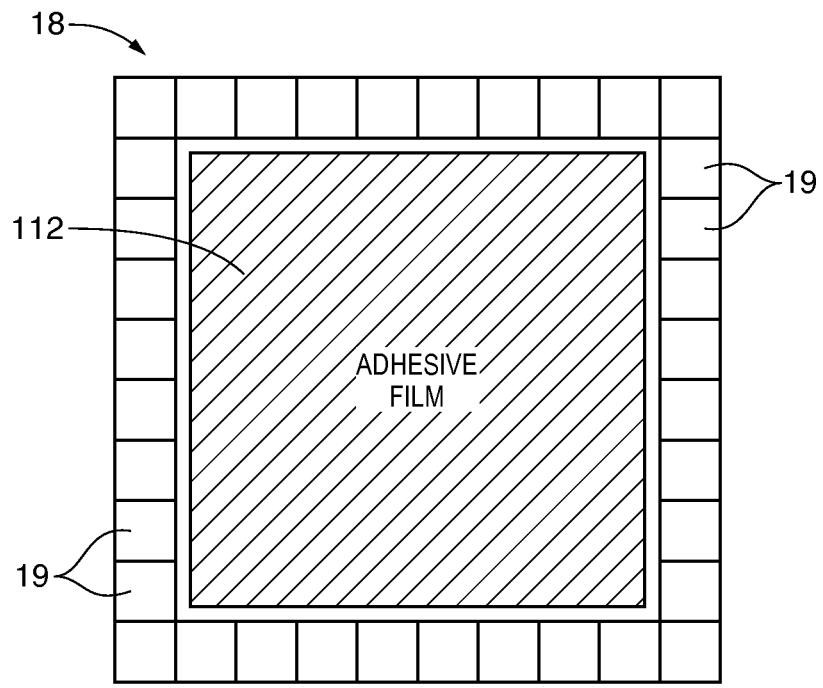
FIGS. 4A and 4B are top views showing illustrative patterns with which an adhesive film can be formed between an image sensor chip and an image signal processing chip in accordance with an embodiment of the present invention.
Figure 4B:
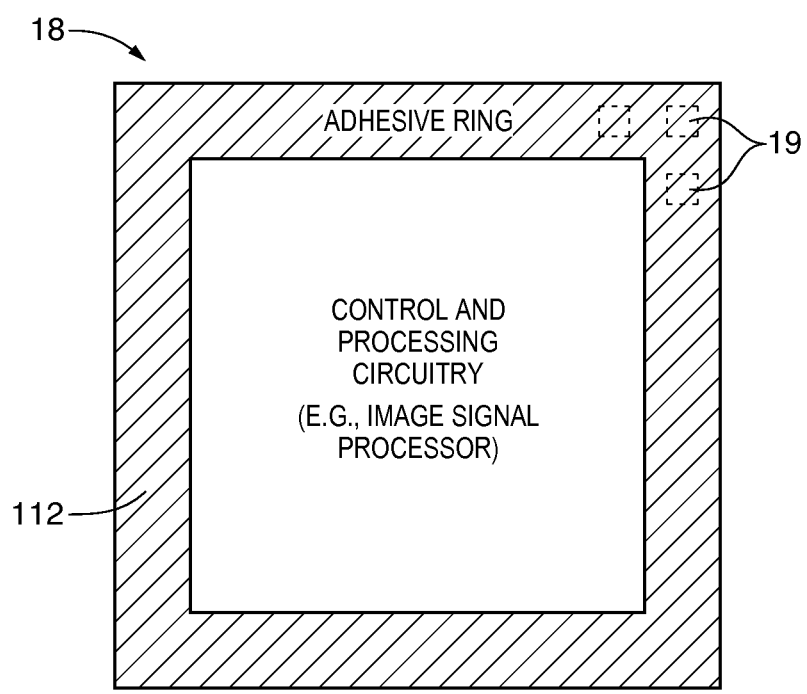

As shown in FIG. 3, a layer of adhesive material 112 may be formed between die 16 and die 18. Adhesive material 112 may, for example, be formed using an epoxy-based adhesive, a rubber-based adhesive, a polyimide-based adhesive, a polyolefin-based adhesive, an acrylic-based adhesive, other suitable dielectric materials, or a combination of these materials. In one suitable embodiment, adhesive film 112 may be disposed in a way such that the area within the image signal processor wire bond pads 19 is substantially covered by film 112 (see, e.g., FIG. 3 and FIG. 4A). In another suitable embodiment, adhesive material 112 may be disposed in a ring pattern that only covers the image signal processor wire bond pads 19 (see, e.g., FIG. 4B). The patterns as shown in FIGS. 4A and 4B are merely illustrative and do not serve to limit the scope of the present invention. If desired, adhesive material 112 may be disposed in any desired pattern over die 18 to sufficiently secure die 16 on top of die 18.

A ring-shaped cover glass support structure such as support structure 114 may be formed between image sensor die 16 and cover glass 118. Cover glass support structure 114 may be formed within the image sensor wire bond pads 33 while not covering the image pixel arrays formed at the surface of die 16 (i.e., the image pixel arrays are capable of receiving incoming light through cover glass 118 without being obstructed by support structure 114). Structure 114 may be formed from polymers such as epoxy resin, polyimide, polyolefin, acrylic, glass, ceramic, other suitable dielectric materials, or a combination of these materials (as examples).

Cover glass 118 may, in general, be formed from clear glass, plastic, or other suitable transparent material. Cover glass 118 may be placed over image sensor die 16 to prevent dust and other undesired particles from contaminating and attaching to the surface of image sensor chip 16. Region 116 that is contained within cover glass 118, image sensor die 16, and support structure 114 may be devoid of air (i.e., a vacuum) and undesired contaminants.

Multi-chip package 99 may be hermetically sealed using a liquid compound such as liquid sealant 120. Liquid sealant 120 may be an epoxy resin sealant, silicone resin sealant, and other suitable types of semiconductor packaging sealants. As shown in FIG. 3, sealant 120 fills in any free space between bond wires 108 and 110 and provides a protective non-conductive layer that extends from the edge of cover glass 118 to the edge of interposer substrate 100.

The configuration of multi-chip package 99 as shown in FIG. 3 is merely illustrative and does not serve to limit the scope of the present invention. In general, dies that are part of a multi-chip package 99 may be contained within a housing that is molded from plastic, resin, ceramic, or other suitable materials. Multi-chip package 99 may contain more than two vertically stacked dies, more than three vertically stacked dies, two horizontally stacked dies (e.g., dies that are positioned laterally with respect to one another on a common interposer substrate), more than two horizontally stacked dies, multiple vertically and horizontal stacked dies, etc.

Figure 5:
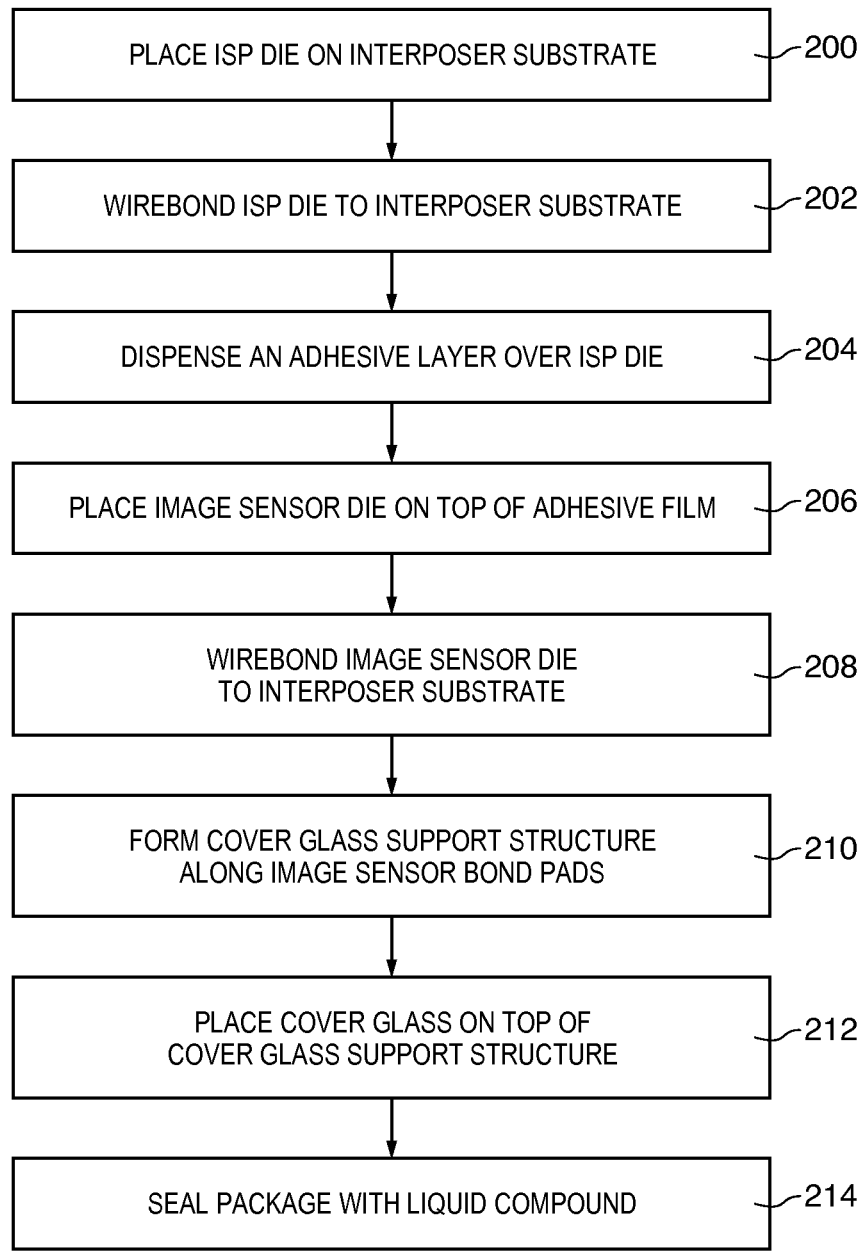
FIG. 5 is a flow chart of illustrative steps involved in forming the multi-chip package of FIG. 3 in accordance with an embodiment of the present invention.

FIG. 5 is a flow chart of illustrative steps involved in forming a multi-chip package of the type described in connection with FIG. 3. At step 200, image signal processing die 18 may be placed on top of interposer substrate 100.

At step 202, image signal processing die 18 may be wire bonded to interposer substrate 100 (e.g., conductive wires 108 may have first ends that are soldered to wire bond pads 19 and second ends that are soldered to corresponding conductive members 102).

At step 204, an uncured adhesive layer 112 may be disposed on top of image signal processor die 18 using dispensing equipment.

While adhesive layer 112 is an uncured state, image sensor die 16 may be placed on top of adhesive layer 112 (step 206). When image sensor die 16 is in its proper position, adhesive layer 112 may be thermally cured (as an example).

At step 208, image sensor die 16 may be wire bonded to interposer substrate 100 (e.g., conductive wires 110 may have first ends that are soldered to wire bond pads 33 and second ends that are soldered to corresponding conductive members 104).

At step 210, ring-shaped cover glass support structure 114 may be formed on top of image sensor die 16 using dispensing equipment.

While support structure 114 is in an uncured state, cover glass 118 may be placed on top of cover glass support structure 144 (step 212). A vacuum pump may be used during step 212 to create a vacuum in region 116 contained within cover glass 118, image sensor die 16, and structure 114. When cover glass 118 is in its proper position, structure 114 may be cured using ultraviolet (UV) light (as an example).

At step 214, multi-chip package 99 may be hermetically sealed using liquid compound 120 (e.g., a thermally-cured epoxy resin) to cover wires 108 and 110 and to secure cover glass 118. Liquid compound 120 may be dispensed and cured without the use of a molding tool.

The steps of FIG. 5 are merely illustrative. If desired, other necessary equipment for forming package 99 of FIG. 3 may be used (e.g., thermal curing equipment, UV curing equipment, soldering equipment, patterning equipment, etc.), and other suitable steps for forming multi-chip package 99 may be performed.

Figure 6:
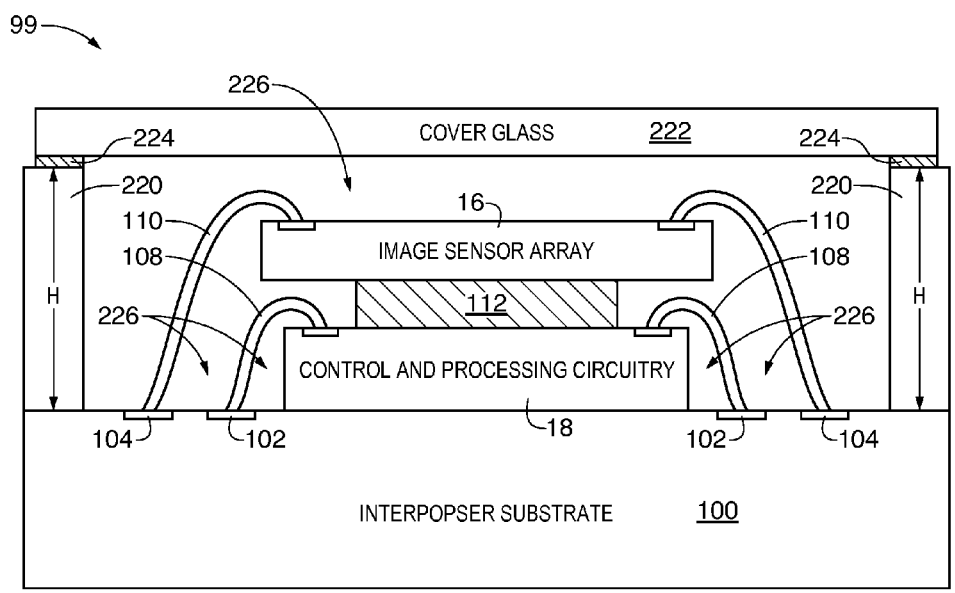
FIG. 6 is a cross-sectional side view of a multi-chip packaging for housing an image sensor chip that is stacked on top of an image signal processing chip in accordance with an embodiment of the present invention.

FIG. 6 shows another suitable arrangement of multi-chip package 99. As shown in FIG. 6, liquid compound 120 need not be used to seal package 66. Instead, multi-chip package 99 may be sealed using a cover glass support structure such as structure 220 that surrounds outer wire contact members 104 and has a height H that extends above image sensor die 16. Support structure 220 may be formed using plastic, ceramic, resin, or other types of dielectric material.

Cover glass 222 may be placed on top of support structure 220. In particular, cover glass 222 may be sufficiently wide to be supported by structure 220. Cover glass 222 may be supported in a way such that the bottom surface of glass 222 does not physically contact any circuitry contained within package 99 (e.g., cover glass 222 should not make direct contact with wires 108, wires 110, die 16, and die 18).

A layer of adhesive material 224 may be formed between cover glass 222 and support structure 224 to hermetically seal package 99. Adhesive material 224 may, for example, be formed using an epoxy-based adhesive, a rubber-based adhesive, a polyimide-based adhesive, a polyolefin-based adhesive, an acrylic-based adhesive, other suitable dielectric materials, or a combination of these materials. Cavity 226 that is contained within cover glass 222, support structure 220, and substrate 100 may be devoid of air (i.e., a vacuum) and undesired contaminants. Cover glass 222 and support structure 220 may collectively serve as a sealing dam for cavity 226 and may therefore sometimes be referred to as a cavity wall or dam wall.

Figure 7:
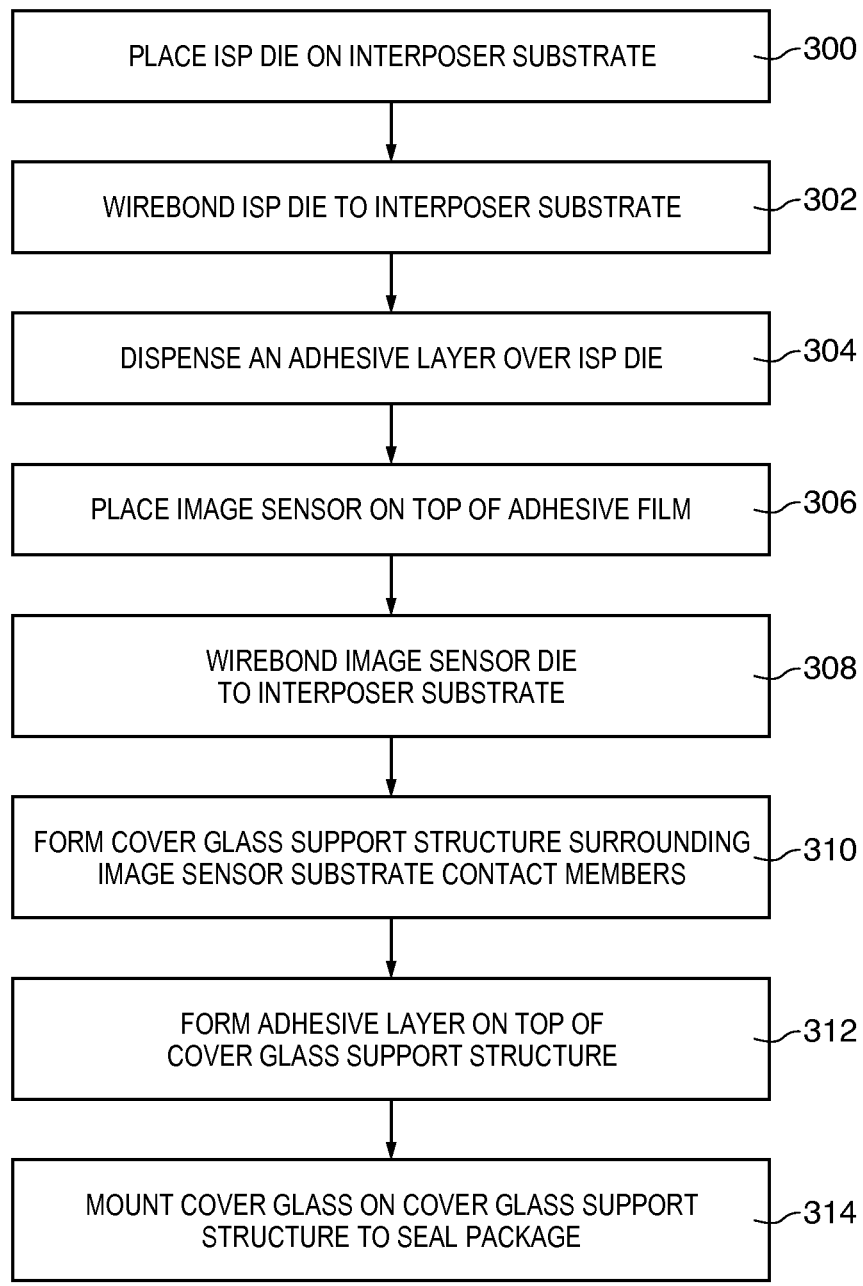
FIG. 7 is a flow chart of illustrative steps involved in forming the multi-chip package of FIG. 6 in accordance with an embodiment of the present invention.

FIG. 7 is a flow chart of illustrative steps involved in forming a multi-chip package of the type described in connection with FIG. 6. At step 300, image signal processing die 18 may be placed on top of interposer substrate 100.

At step 302, image signal processing die 18 may be wire bonded to interposer substrate 100 (e.g., conductive wires 108 may have first ends that are soldered to wire bond pads 19 and second ends that are soldered to corresponding conductive members 102).

At step 304, an uncured adhesive layer 112 may be disposed on top of image signal processor die 18 using dispensing equipment.

While adhesive layer 112 is an uncured state, image sensor die 16 may be placed on top of adhesive layer 112 (step 306). When image sensor die 16 is in its proper position, adhesive layer 112 may be thermally cured (as an example).

At step 308, image sensor die 16 may be wire bonded to interposer substrate 100 (e.g., conductive wires 110 may have first ends that are soldered to wire bond pads 33 and second ends that are soldered to corresponding conductive members 104).

At step 310, a ring-shaped cavity wall 220 may be formed to surround stacked dies 16 and 18 and associated contact members 104 and 102.

At step 312, an uncured adhesive layer 224 may be disposed on top of cavity wall 220 using dispensing equipment. While adhesive 224 is in the uncured state, cover glass 222 may be mounted on top of cavity wall 200 (step 314). A vacuum pump may be used during step 314 to create a vacuum in region 226 that is contained within cover glass 222, cavity wall 220, and substrate 100. When cover glass 222 is in its proper position, adhesive 224 may be cured using UV light (as an example).

The steps of FIG. 7 are merely illustrative. If desired, other necessary equipment and/or steps for forming package 99 of FIG. 6 may be used.

Figure 8:
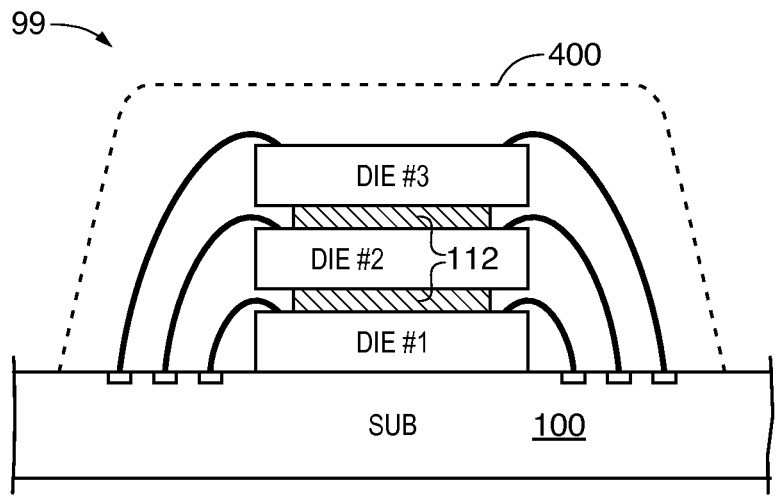
FIGS. 8, 9, and 10 are diagrams showing illustrative multi-chip configurations that can be housed using a packaging arrangement of the type as shown in FIGS. 3 and 6 in accordance with an embodiment of the present invention.
Figure 9:
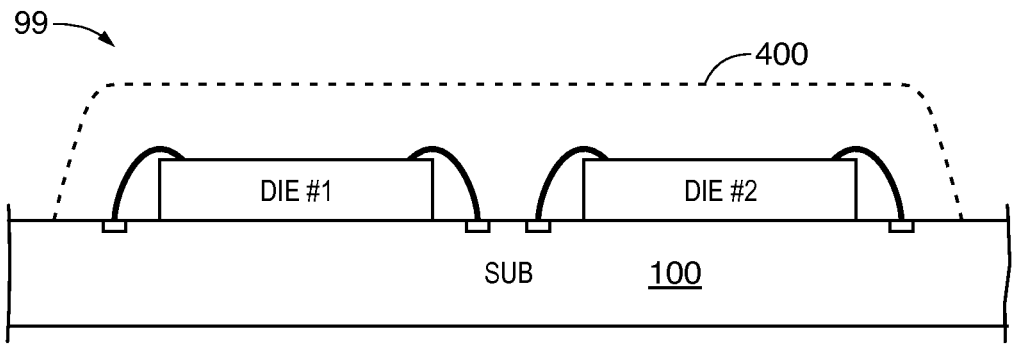
Figure 10:
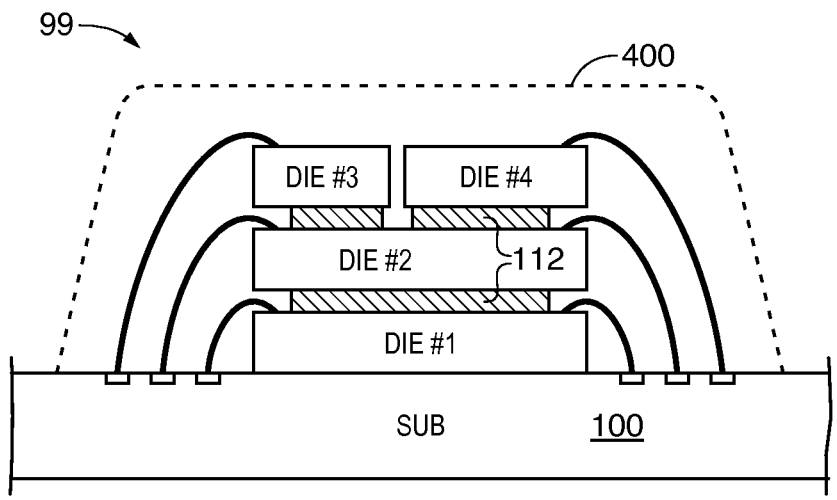

In general, the multi-chip package configurations as described in connection with FIGS. 3 and 6 are merely exemplary and can be used to house other types of multi-chip arrangements. As an example, multi-chip imaging package 99 may be used to house three vertically stacked chips, at least one of which is an image sensor die (see, e.g., FIG. 8). As another example, multi-chip imaging package 99 may include two horizontally stacked dies, at least one of which is an image sensor die (see, e.g., FIG. 9). As another example (see, e.g., FIG. 10), multi-chip imaging packaging 99 may include vertically stacked dies (i.e., dies #1 and #2) and horizontally stacked dies (i.e., dies #3 and #4), where the horizontally stacked dies are vertically stacked on top of die #2. Each of the different multi-chip configurations of FIGS. 8, 9, and 10 may be sealed using the packaging methods as described in connection with in FIGS. 5 and 7 (see, sealing barrier 400).

Various embodiments have been described illustrating different multi-chip packaging arrangements that can be used for imaging systems. In one suitable embodiment, a multi-chip package may include a semiconductor package substrate, at least a first integrated circuit and a second integrated circuited mounted on top of a semiconductor substrate, and a cover glass. The second integrated circuit may be stacked on top of the first integrated circuit. The first integrated circuit may be an image signal processing integrated circuit, whereas the second integrated circuit may be an image sensor integrated circuit.

The first and second integrated circuits may be wire bonded to the substrate. In particular, the first integrated circuit may be wire bonded to the substrate through a first set of wires while the second integrated circuit may be wire bonded to the substrate through a second set of wires. Signals may be conveyed between the first and second integrated circuits via the first and second sets of wires and conductive traces formed in the substrate.

An adhesive layer may be formed between the first and second integrated circuits. The cover glass may be suspended over the second integrated circuit using a ring-shaped support structure resting on the second integrated circuit. A region within the multi-chip package that is surrounded by the cover glass, the supporting structure, and the second integrated circuit may be devoid of air. A liquid compound may be dispensed over the bond wires with the use of molding equipment to hermetically seal the multi-chip package.

In another suitable embodiment, a support structure that surrounds the first and second integrated circuits and the first and second set of wires may be formed. The support structure may have a top surface supporting the cover glass and a bottom surface resting on the substrate. The cover glass supported using this arrangement may be suspended over the second integrated circuit so that the cover glass does not make contact with the second integrated circuit and the associated bonding wires. Adhesive material may be formed between the cover glass and the top surface of the support structure. The cover glass, the supporting structure, and the substrate may surround an internally sealed cavity region within which the first and second integrated circuits are contained, and wherein the internally sealed cavity region is devoid of air.

The foregoing is merely illustrative of the principles of this invention which can be practiced in other embodiments.

What is claimed is:

1. A multi-chip package, comprising:
   a substrate;
   a first integrated circuit mounted on the substrate;
   a second integrated circuit stacked on top of the first integrated circuit;
   a cover glass positioned over the second integrated circuit, wherein the cover glass is configured to receive incoming light that is captured using circuitry on the second integrated circuit; and
   a ring-shaped adhesive layer formed between the first integrated circuit and the second integrated circuit, wherein the ring-shaped adhesive layer surrounds an empty hole interposed between the first and second integrated circuits.

2. The multi-chip package defined in claim 1, wherein the first integrated circuit comprises an image signal processing integrated circuit, wherein the second integrated circuit comprises an image sensor integrated circuit, and wherein the circuitry on the second integrated circuit comprises a plurality of image sensor pixels.

3. The multi-chip package defined in claim 1, wherein the adhesive layer comprises an adhesive material selected from the group consisting of: an epoxy-based adhesive, a rubber-based adhesive, a polyimide-based adhesive, a polyolefin-based adhesive, and an acrylic-based adhesive.

4. The multi-chip package defined in claim 1, further comprising:
   a support structure interposed between the cover glass and the second integrated circuit structure.

5. The multi-chip package defined in claim 1, further comprising:
   a support structure surrounding the first and second integrated circuit, wherein the support structure has a top surface supporting the cover glass and a bottom surface resting on the substrate.

6. The multi-chip package defined in claim 5, further comprising:
   an adhesive layer formed between the top surface of the supporting structure and the cover glass, wherein the cover glass, the supporting structure, and the substrate surrounds a space within which the first and second integrated circuits are contained, and wherein the space is devoid of air.

7. The multi-chip package defined in claim 1, further comprising:
   a sealing compound that hermetically seals the multi-chip package and that is formed from a different material than the ring-shaped adhesive layer.

8. A method for manufacturing a multi-chip package, comprising:
   placing first and second integrated circuit dies on a substrate;
   placing a cover glass over the first and second integrated circuit dies, wherein the cover glass is configured to receive incoming light that is captured using circuitry on the second integrated circuit die; and
   forming a ring-shaped adhesive layer between the first and second integrated circuit dies, wherein the ring-shaped adhesive layer overlaps with wire bond pads formed on the first integrated circuit die, and wherein the ring-shaped adhesive layer surrounds an empty hole interposed between the first and second integrated circuits.

9. The method defined in claim 8, wherein placing the first and second integrated circuit dies on the substrate comprises mounting the first integrated circuit die on the substrate and vertically stacking the second integrated circuit die on top of the first integrated circuit die.

10. The method defined in claim 9, wherein the first integrated circuit die comprises an image signal processor die, wherein the second integrated circuit die comprises a image sensor die, and wherein the circuitry on the second integrated circuit die comprises a plurality of image sensor pixels formed on the image sensor die.

11. The method defined in claim 8, further comprising:
   forming a support structure on the substrate that suspends the cover glass over the second integrated circuit die.

12. The method defined in claim 11, wherein the support structure has a lower surface that contacts the substrate and an upper surface that supports the cover glass.

13. The method defined in claim 12, further comprising:
   forming a layer of adhesive between the upper surface of the support structure and the cover glass to hermetically seal the multi-chip package.

14. The method defined in claim 13, wherein the substrate, the cover glass, and the support structure form a cavity that surrounds the first and second integrated circuit dies.

15. The method defined in claim 14, wherein the cavity is a vacuum.

16. The method defined in claim 8, further comprising:
forming a ring-shaped support structure on the second integrated circuit die that suspends the cover glass over the second integrated circuit die.

17. The method defined in claim 8, further comprising:
wire-bonding the first integrated circuit die to the substrate; and
wire-bonding the second integrated circuit die to the substrate, wherein signals are conveyed between the first and second integrated circuit dies via conductive traces formed in the substrate.

18. The method defined in claim 8, further comprising:
after forming the ring-shaped adhesive layer between the first and second integrated circuit dies, disposing a sealant over the first and second integrated circuit dies to seal the multi-chip package.

\* \* \* \* \*